United States Patent
Yoshimura

(10) Patent No.: US 6,334,569 B1
(45) Date of Patent: Jan. 1, 2002

(54) REFLOW SOLDERING APPARATUS AND REFLOW SOLDERING METHOD

(75) Inventor: Hideaki Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/539,627

(22) Filed: Mar. 31, 2000

(30) Foreign Application Priority Data

Sep. 3, 1999 (JP) .................................................. 11-250074

(51) Int. Cl.$^7$ ............................. B23K 31/02; B23K 31/00
(52) U.S. Cl. ................................ 228/180.1; 228/180.22; 228/6.2; 228/102
(58) Field of Search ........................... 228/180.1, 180.22, 228/102, 103, 6.2, 56.5; 29/729, 739

(56) References Cited

U.S. PATENT DOCUMENTS

| | | | | |
|---|---|---|---|---|
| 3,961,413 A | * | 6/1976 | Noe .............................. | 29/569 R |
| 4,160,893 A | * | 7/1979 | Meyen et al. ............ | 219/85 BA |
| 4,569,473 A | * | 2/1986 | Guiliano ........................ | 228/264 |
| 4,610,388 A | * | 9/1986 | Koltuniak et al. ............. | 228/6.2 |
| 4,696,096 A | * | 9/1987 | Green et al. ..................... | 29/829 |
| 5,240,549 A | * | 8/1993 | Hamburgen et al. ... | 156/583.91 |
| 5,415,331 A | * | 5/1995 | Lin ................................ | 228/213 |
| 5,553,768 A | * | 9/1996 | Lasto et al. ................... | 228/102 |
| 5,560,531 A | * | 10/1996 | Ruszowski ..................... | 228/19 |
| 5,573,174 A | * | 11/1996 | Pekol ............................. | 228/219 |
| 5,735,450 A | * | 4/1998 | Heim et al. ................... | 228/191 |
| 5,785,237 A | * | 7/1998 | Lasto et al. ............. | 228/180.22 |
| 5,794,329 A | * | 8/1998 | Rossmeisl et al. ............. | 29/743 |
| 5,871,811 A | * | 2/1999 | Wang et al. ............... | 427/248.1 |
| 6,220,503 B1 | * | 2/1999 | Cox et al. ...................... | 228/265 |
| 5,877,079 A | * | 3/1999 | Karasawa et al. ........... | 438/613 |
| 5,878,943 A | * | 3/1999 | Nishikawa et al. .......... | 228/205 |

FOREIGN PATENT DOCUMENTS

JP          9-172253         6/1997

\* cited by examiner

*Primary Examiner*—Tom Dunn
*Assistant Examiner*—L. Edmondson
(74) *Attorney, Agent, or Firm*—Armstrong, Westerman, Hattori, McLeland & Naughton, LLP

(57) ABSTRACT

A reflow soldering apparatus for soldering a first component mounted on a substrate with a first solder having a first melting point and soldering a second component mounted on the substrate with a second solder having a second melting point higher than the first melting point. The reflow soldering apparatus includes a heat source for substantially uniformly heating the substrate, a capsule for enclosing the second component, and a vacuum pump for decreasing the pressure in the capsule. The melting point of the second solder can be lowered by operating the vacuum pump to decrease the pressure in the capsule by a given amount, so that the first component and the second component can be reflow-soldered at substantially the same temperature.

12 Claims, 6 Drawing Sheets

F I G. 3
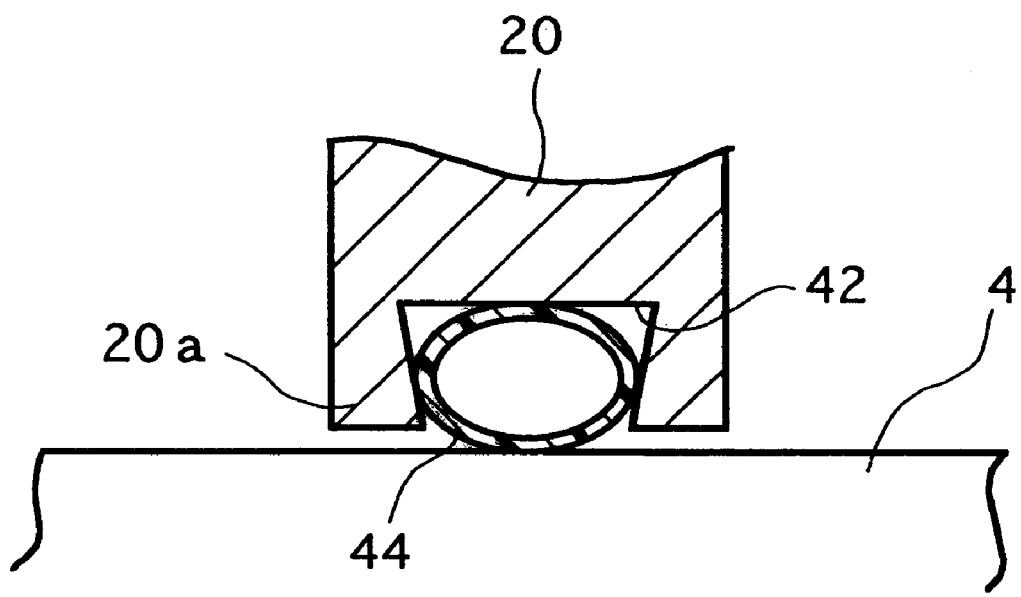

REFLOW SOLDERING APPARATUS AND REFLOW SOLDERING METHOD

BACKGROUND OF THE INVENTION

1. Field of the Invention

The present invention relates to a reflow soldering apparatus and a reflow soldering method.

2. Description of the Related Art

The reflow soldering method is a method including preliminarily supplying a solder to a soldering position and melting the solder by using a heat source such as hot air blast, infrared radiation, and laser to thereby perform soldering. This method forms an increasing proportion of soldering methods in the recent electronic industry. This is mainly due to the fact that chip components have been used in place of conventional components with leads in concert with a reduction in size of electronic equipment and that a planar packaging method has been introduced to increase a packaging density, causing the necessity of precise and efficient soldering at a microscopic soldering region.

The electronic equipment is configured by soldering various electronic components to a substrate. Particularly, some field mainly including a computer field requiring high performance adopts a stepped soldering technique such that the melting points of solders bonding the electronic components mounted on the substrate are stepwise changed. The stepped soldering technique is mainly intended to prevent remelting of the solders bonding the mounted components due to thermal stress in the subsequent steps and also to after-solder a component having a low heat resistance.

In a conventional reflow soldering apparatus, electronic components mounted on a substrate are soldered by using an infrared radiation reflow furnace or a hot air blast furnace, for example, to apply heat to the substrate under substantially the same condition. Accordingly, in the case of applying the stepped soldering method to the conventional reflow soldering apparatus, a first soldering step using a solder having a higher melting point is first carried out and a second soldering step using a solder having a lower melting point is next carried out.

Accordingly, to perform reflow soldering using solders having different melting points, the stepped soldering technique must be adopted, so that much time is required to cause a reduction in soldering efficiency. Further, the conventional reflow soldering apparatus has another problem that it is difficult to melt only the solder having a higher melting point without melting the solder having a lower melting point on the same substrate and to thereafter resolder the same component for repair.

SUMMARY OF THE INVENTION

It is therefore an object of the present invention to provide a reflow soldering apparatus and a reflow soldering method which can simultaneously solder a plurality of electronic components by using a plurality of solders having different melting points under the atmospheric pressure.

It is another object of the present invention to provide a reflow soldering apparatus which can realize easy repair of a component soldered to a substrate by means of a solder having a higher melting point without melting a solder having a lower melting point on the same substrate.

In accordance with an aspect of the present invention, there is provided a reflow soldering apparatus for soldering a first component mounted on a substrate with a first solder having a first melting point and soldering a second component mounted on the substrate with a second solder having a second melting point higher than the first melting point, comprising heating means for substantially uniformly heating the substrate; a capsule for enclosing the second component; and evacuating means for decreasing the pressure in the capsule; the first component and the second component being reflow-soldered at substantially the same temperature by operating the evacuating means to decrease the pressure in the capsule by a given amount.

Preferably, the reflow soldering apparatus further comprises a pressure sensor for detecting the pressure in the capsule, a temperature sensor for detecting the temperature in the capsule, and a control unit for controlling the evacuating means and the heating means according to the pressure and the temperature respectively detected by the pressure sensor and the temperature sensor.

In accordance with another aspect of the present invention, there is provided a reflow soldering apparatus for selectively melting any one of solders bonding a plurality of components to a substrate, comprising heating means for heating the substrate; a capsule for selectively enclosing any one of the components bonded by the solder to be melted; and evacuating means for decreasing the pressure in the capsule; only the solder bonding the component selectively enclosed in the capsule being melted by operating the evacuating means to decrease the pressure in the capsule by a given amount.

After the solder bonding the component selectively enclosed in the capsule is melted, a solder is applied again to the substrate to carry out resoldering of the same component by remelting this solder.

In accordance with a further aspect of the present invention, there is provided a reflow soldering method comprising the steps of: applying a first solder having a first melting point to a first footprint formed on a substrate; applying a second solder having a second melting point higher than the first melting point to a second footprint formed on the substrate; mounting a first component on the substrate so that a lead of the first component comes into contact with the first solder; mounting a second component on the substrate so that a lead of the second component comes into contact with the second solder; enclosing the second component in a capsule; decreasing the pressure in the capsule; and heating the substrate to a temperature higher than or equal to the first melting point to simultaneously solder the first and second components.

In accordance with a still further aspect of the present invention, there is provided a reflow soldering apparatus for soldering a first component mounted on a substrate with a first solder having a first melting point and soldering a second component mounted on the substrate with a second solder having a second melting point higher than the first melting point, comprising: heating means for substantially uniformly heating the substrate; a capsule for enclosing the first component; and pressurizing means for increasing the pressure in the capsule; the first component and the second component being reflow-soldered at substantially the same temperature by operating the pressurizing means to increase the pressure in the capsule by a given amount.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 3 is an enlarged sectional view of a lower end portion of a capsule;

DESCRIPTION OF THE PREFERRED EMBODIMENTS

Figure 1:
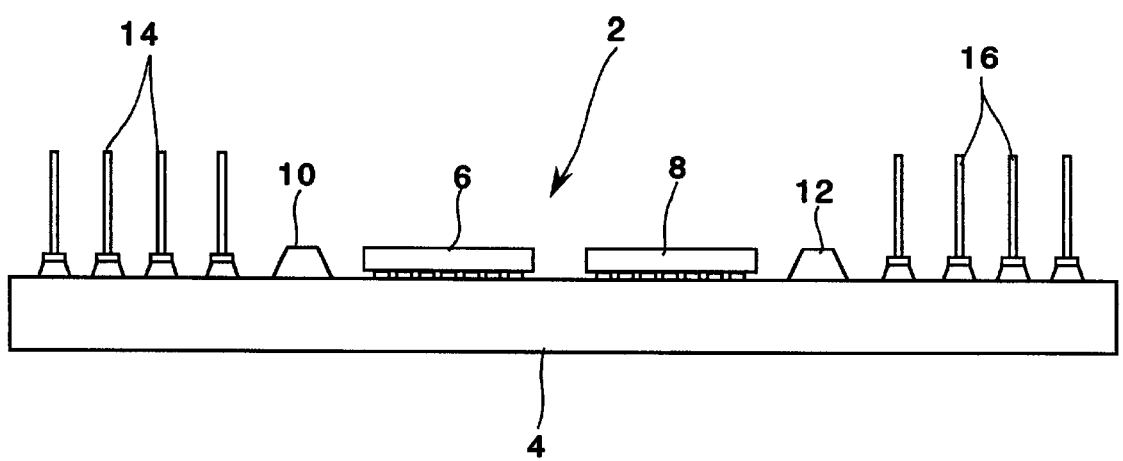
FIG. 1 is a schematic illustration of a multichip module.

Referring to FIG. 1, there is shown a schematic illustration of a multichip module (MCM) 2 to be mounted in a general-purpose computer or workstation, for example. LSIs 6 and 8, chip components 10 and 12, and IO terminals 14 and 16 are soldered on a ceramic substrate 4. For example, the LSIs 6 and 8 and the chip components 10 and 12 are soldered by using a Pb—Sn solder containing 95 to 97 wt. % of Pb, and the IO terminals 14 and 16 are soldered by using an Au—Sn solder containing 80 wt. % of Au.

The Pb-Sn solder containing 95 to 97 wt. % of Pb has melting point of 314 to 320° c., and the Au—Sn solder containing 80 wt. % of Au has a melting point of 280° C. In the case of a general reflow soldering apparatus, a soldering temperature of about 330° C. is required. The reason for use of the Au alloy solder for soldering of the IO terminals 14 and 16 is to require a large bonding strength.

Figure 2:
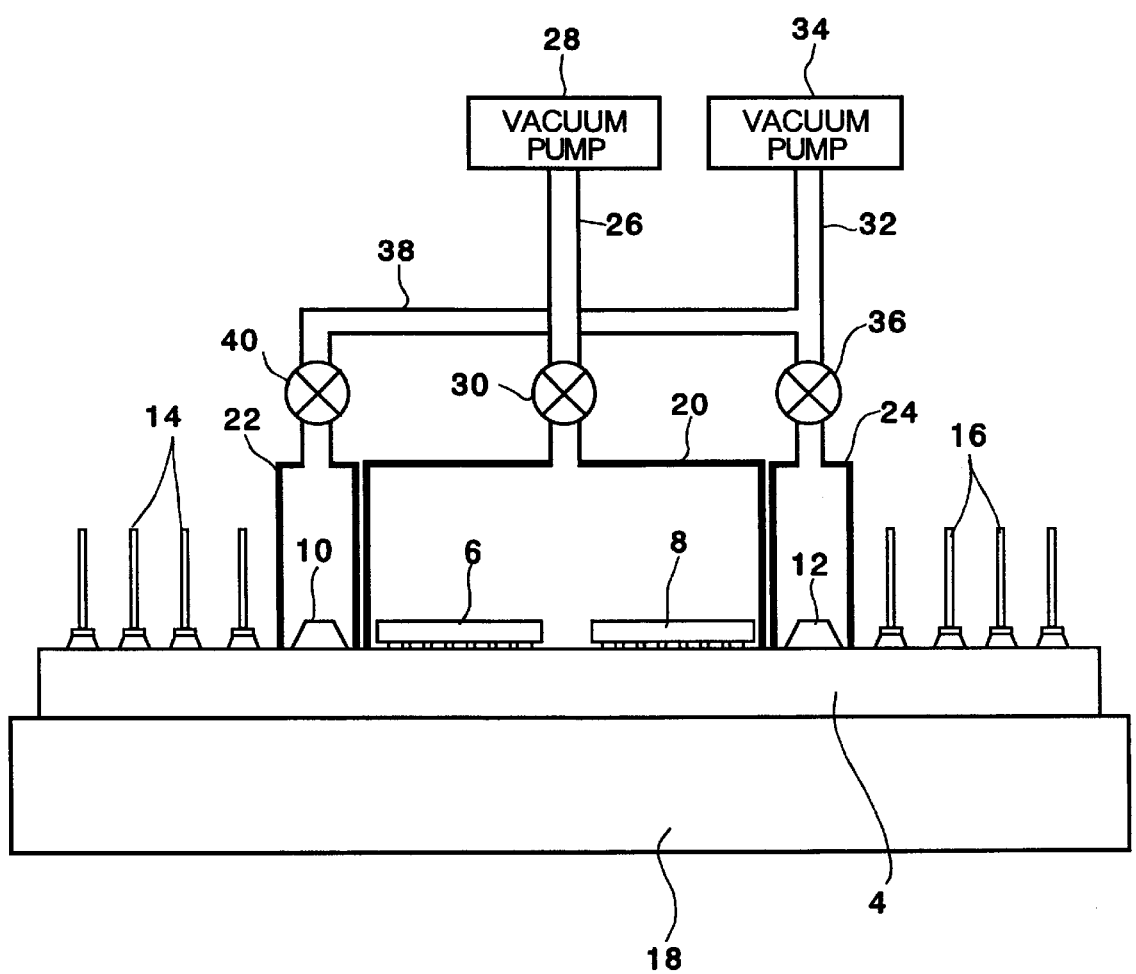
FIG. 2 is a schematic illustration of a reflow soldering apparatus according to a first preferred embodiment of the present invention.

Referring to FIG. 2, there is shown a reflow soldering apparatus according to a first preferred embodiment of the present invention suitable for manufacturing of the above-mentioned MCM 2. Reference numeral 18 denotes a heat source such as a hot plate for heating the solders. The ceramic substrate 4 is mounted on the heat source 18. The LSIs 6 and 8 are enclosed by a capsule (cap) 20. The chip components 10 and 12 are enclosed by capsules 22 and 24, respectively. The capsule 20 is connected through a conduit 26 to a vacuum pump 28. The conduit 26 is provided with a valve 30 for selectively opening and closing the conduit 26.

The capsule 24 is connected through a conduit 32 to a vacuum pump 34. The conduit 32 is provided with a valve 36 for selectively opening and closing the conduit 32. The capsule 22 is connected through a conduit 38 and the conduit 32 to the vacuum pump 34. The conduit 38 is provided with a valve 40 for selectively opening and closing the conduit 38. As shown in FIG. 3, the capsule 20 has an open lower end 20a formed with a groove 42, and an O-ring 44 is fitted with the groove 42. The O-ring 44 is formed of a heat-resistive resin such as polyamide resin capable of ensuring a relatively high soldering temperature. Although not shown, similar O-rings are fitted with similar grooves formed along the lower ends of the capsules 22 and 24. The capsules 20, 22, and 24 are formed of metal such as stainless steel capable of ensuring a relatively high soldering temperature. Alternatively, the capsules 20, 22, and 24 may be formed of glass.

When the valves 30, 36, and 40 are opened to operate the vacuum pumps 28 and 34, the capsules 20, 22, and 24 are evacuated. During the evacuation, the O-rings 44 of the capsules 20, 22, and 24 come into pressure contact with the ceramic substrate 4, thereby sealing the capsules 20, 22, and 24. For example, the evacuation of the capsules 20, 22, and 24 down to $10^{-9}$ Torr results in a decrease in melting point of the solder by about 100° C. Accordingly, the vacuum pumps 28 and 34 are operated to evacuate the capsules 20, 22, and 24 by a given amount until the melting point of the Pb—Sn solder containing 95 to 97 wt. % of Pb for soldering the LSIs 6 and 8 and the chip components 10 and 12 is decreased to about 280° C.

That is, by evacuating the capsules 20, 22, and 24, the melting points of the two different solders, i.e., the Pb-Sn solder for the LSIs 6 and 8 and the chip components 10 and 12 and the Au—Sn solder for the IO terminals 14 and 16, can be set to the same temperature of 280° C. Accordingly, the LSIs 6 and 8, the chip components 10 and 12, and the IO terminals 14 and 16 can be simultaneously soldered at a relatively low temperature. Further, the IO terminals 14 and 16 may also be enclosed by similar capsules connected to a vacuum pump, and all the capsules enclosing the LSIs 6 and 8, the chip components 10 and 12, and the IO terminals 14 and 16 may be evacuated. In this case, the temperature of simultaneous soldering of the LSIs 6 and 8, the chip components 10 and 12, and the IO terminals 14 and 16 can be further lowered.

Figure 4:
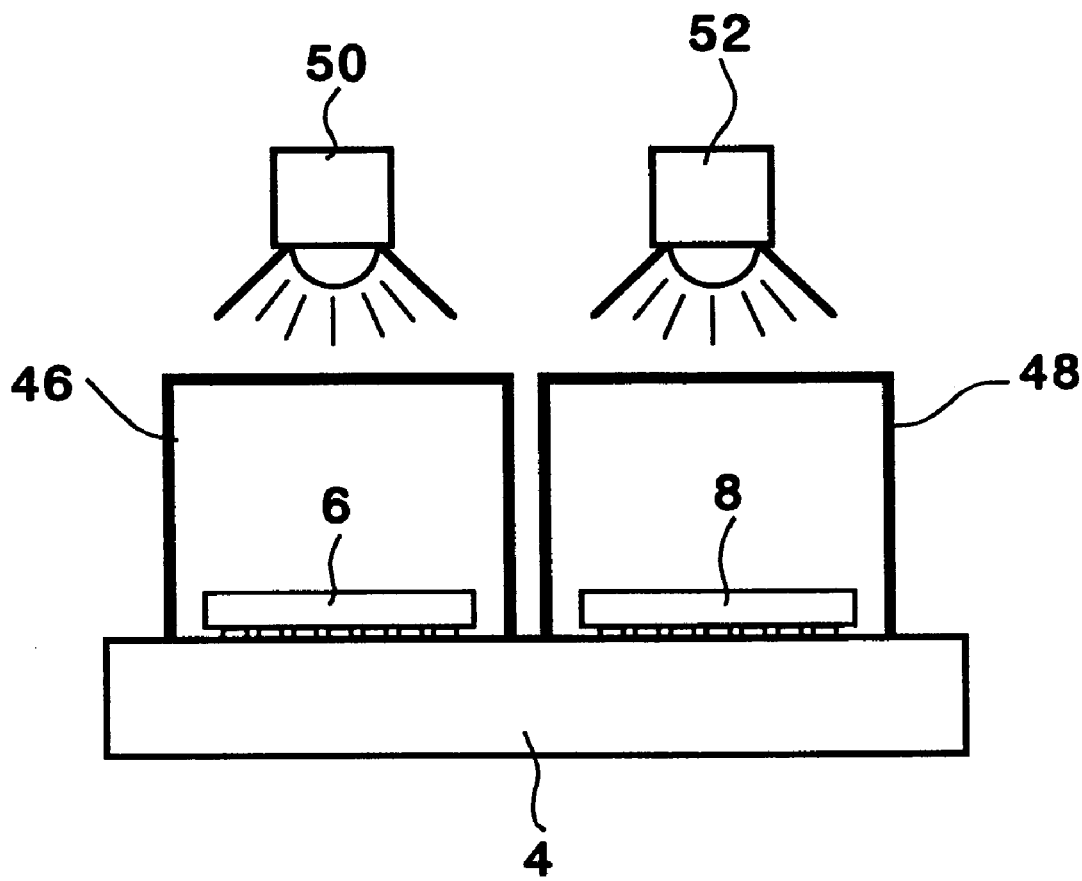
FIG. 4 is a schematic illustration showing an example of noncontact heating.

Referring to FIG. 4, there is shown a schematic illustration of a reflow soldering apparatus having noncontact heat sources 50 and 52. The LSIs 6 and 8 mounted on the ceramic substrate 4 are enclosed in capsules 46 and 48, respectively. The capsules 46 and 48 are connected to vacuum pumps (not shown), respectively. Accordingly, the pressures in the capsules 46 and 48 can be individually adjusted.

Figure 5:
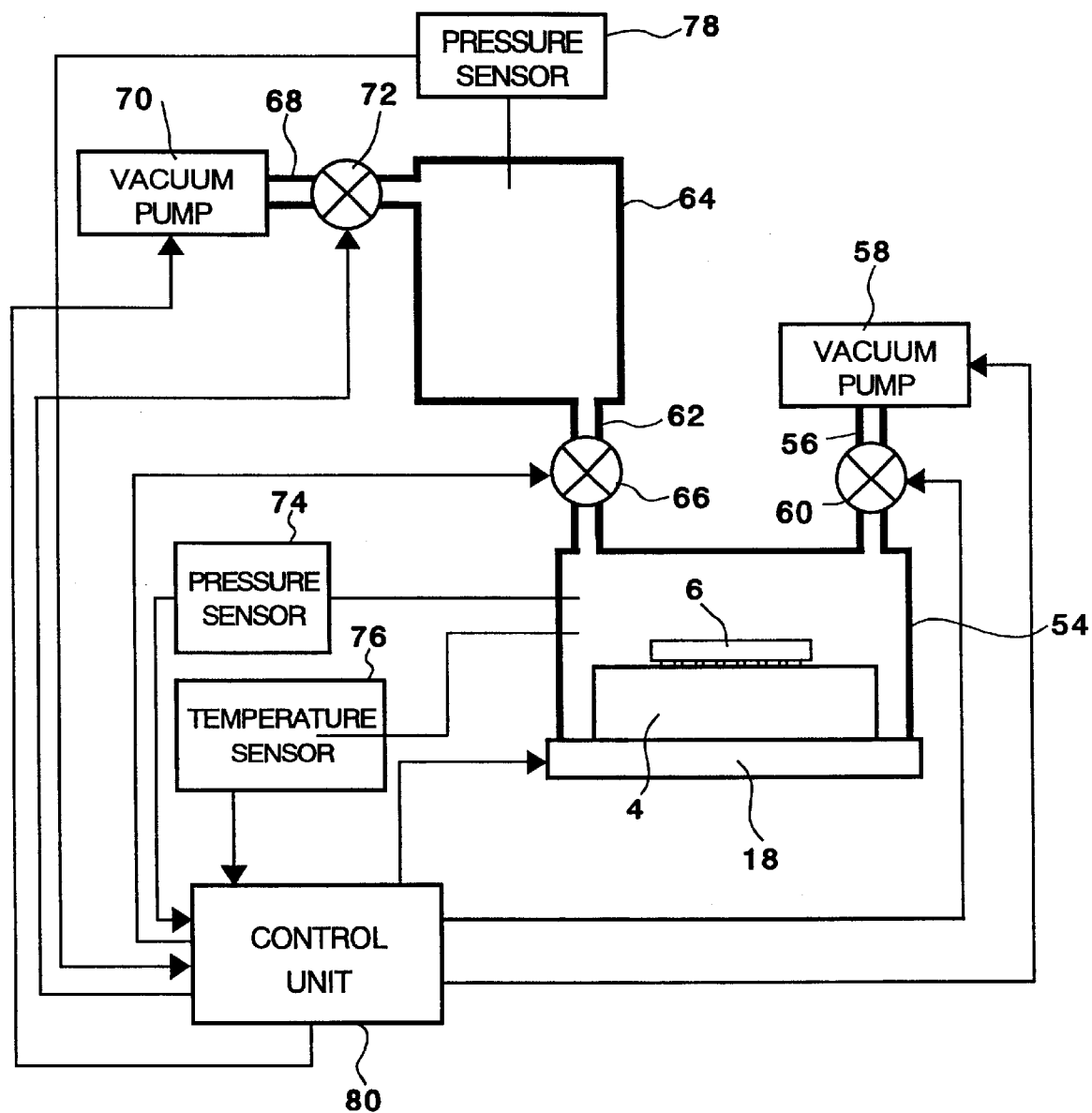
FIG. 5 is a schematic illustration of a reflow soldering apparatus according to a second preferred embodiment of the present invention.

Referring to FIG. 5, there is shown a schematic illustration of a reflow soldering apparatus according to a second preferred embodiment of the present invention. The LSI 6 mounted on the ceramic substrate 4 is enclosed by a capsule 54. The capsule 54 is connected through a conduit 56 to a vacuum pump 58. The conduit 56 is provided with a valve 60 for selectively opening and closing the conduit 56. The capsule 54 is further connected through a conduit 62 to a pressure regulating chamber 64. The conduit 62 is provided with a valve 66 for selectively opening and closing the conduit 62. The pressure regulating chamber 64 is connected through a conduit 68 to a vacuum pump 70. The conduit 68 is provided with a valve 72 for selectively opening and closing the conduit 68.

The pressure in the capsule 54 is detected by a pressure sensor 74, and the detected pressure from the pressure sensor 74 is input into a control unit 80. The temperature in the capsule 54 is detected by a temperature sensor 76, and the detected temperature from the temperature sensor 76 is input into the control unit 80. The pressure in the pressure regulating chamber 64 is detected by a pressure sensor 78, and the detected pressure from the pressure sensor 78 is input into the control unit 80. The control unit 80 controls the operations of the heat source 18, the vacuum pumps 58 and 70, and the valves 60, 66, and 72. An O-ring similar to that shown in FIG. 3 is fitted with a groove formed along the lower end of the capsule 54.

In a first operation mode of this preferred embodiment, the valve 66 is closed, and the valve 60 is opened to operate the vacuum pump 58, thereby evacuating the capsule 54. The operation of the vacuum pump 58 is controlled by the control unit 80 according to the pressure in the capsule 54 detected by the pressure sensor 74, thereby reducing the pressure in the capsule 54 to a desired value. The operation of the heat source 18 is controlled by the control unit 80 according to the temperature in the capsule 54 detected by the temperature sensor 76, thereby setting the soldering temperature for the LSI 6 to a desired value.

In a second operation mode of this preferred embodiment, the pressure regulating chamber 64 and the vacuum pump 70 are used solely or in combination with the vacuum pump 58. The pressure regulating chamber 64 is preliminarily evacuated to a given pressure by the vacuum pump 70. Accordingly, when the valve 60 is closed and the valve 66 is opened, the capsule 54 is instantaneously evacuated by the reduced pressure from the pressure regulating chamber 64. Thereafter, in the case that the valve 66 is closed and the valve 60 is opened to operate the vacuum pump 58, the capsule 54 can be further evacuated to a target pressure in a short time.

Also in this operation mode, the operation of the heat source 18 is controlled by the control unit 80 according to the temperature in the capsule 54 detected by the temperature sensor 76, so that the LSI 6 can be soldered to the ceramic substrate 4 at a desired temperature. While the single component (LSI 6) is mounted on the ceramic substrate 4 in the preferred embodiment shown in FIG. 5, a plurality of components may be mounted on the ceramic substrate 4. In this case, each component may be enclosed by a capsule connected to a vacuum pump and a pressure regulating chamber. With this arrangement, the soldering temperatures for the individual components can be freely changed.

Figure 6:
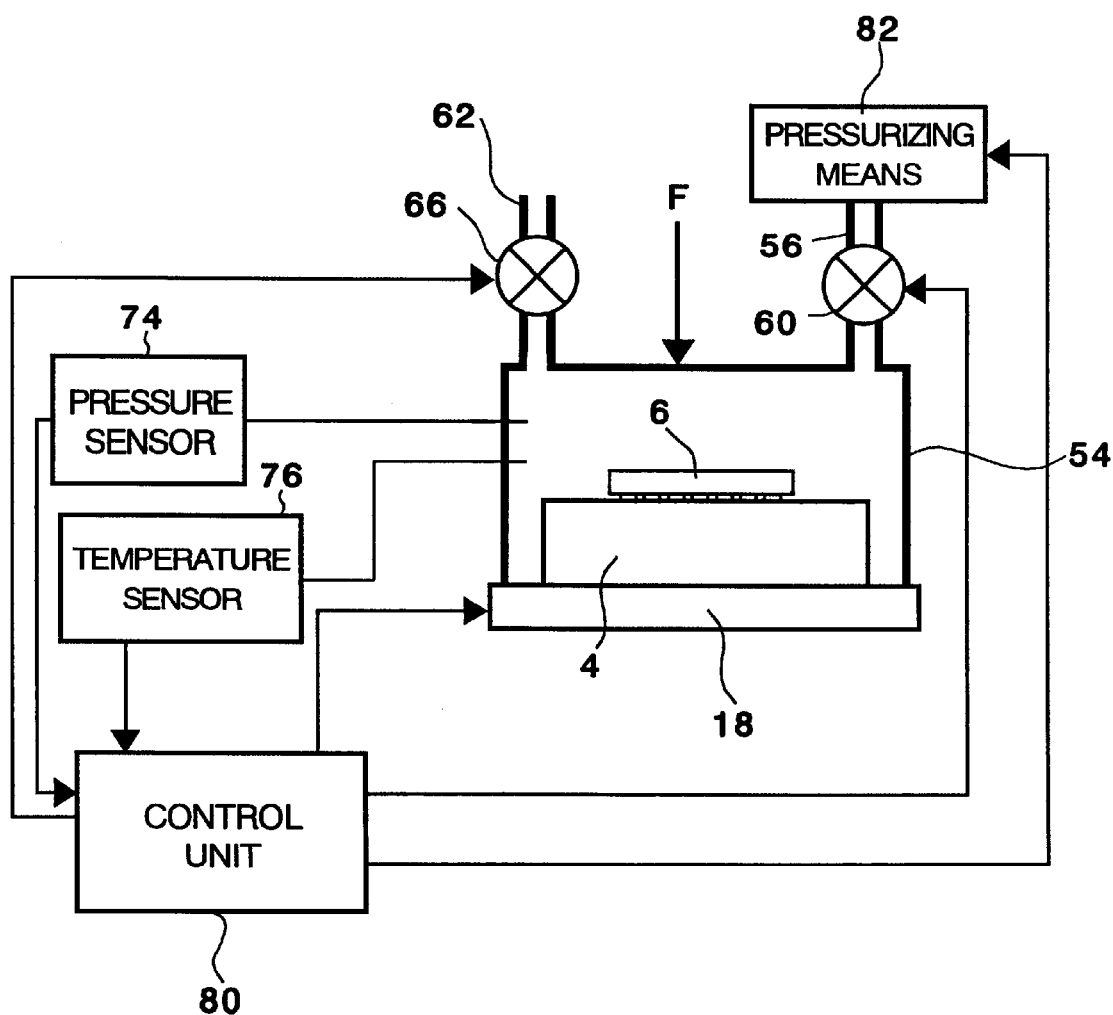
FIG. 6 is a schematic illustration of a reflow soldering apparatus according to a third preferred embodiment of the present invention.

Referring to FIG. 6, there is shown a schematic illustration of a reflow soldering apparatus according to a third preferred embodiment of the present invention. This preferred embodiment employs pressurizing means 82 such as a compressor in place of the vacuum pump 58 used in the second preferred embodiment shown in FIG. 5. The capsule 54 is connected through the conduit 56 to the pressurizing means 82. The pressurizing means 82 is operated in the condition where an external force F is applied to the capsule 54 to press it against the heat source 18. Accordingly, the pressure in the capsule 54 is increased to result in an increase in melting point of the solder for the soldering the LSI 6. The pressure in the capsule 54 is detected by the pressure sensor 74, and the temperature in the capsule 54 is detected by the temperature sensor 76.

According to this preferred embodiment, the melting point of the solder in the capsule 54 can be increased by increasing the pressure in the capsule 54. Accordingly, by combining this preferred embodiment and the second preferred embodiment shown in FIG. 5, the soldering temperatures for the individual components can be controlled relatively freely.

Further, it is considered to put this preferred embodiment into the following application. An inert gas is substituted for the gas contained in the capsule 54 by operating the pressurizing means 82 with the valves 60 and 66 opened, and the valve 66 is next closed to increase the pressure of the inert gas in the capsule 54. In this case, the soldering is carried out in an inert atmosphere, so that this preferred embodiment is effective especially in the case that the solder material is susceptible to oxidation. In addition, the atmosphere in the capsule 54 may be changed to any atmosphere (e.g., oxygen or hydrogen atmosphere) suitable for different solder materials as required.

The reflow soldering apparatus of the present invention may be conveniently used for repair of a component previously soldered on a substrate. That is, by evacuating the capsule enclosing a first component soldered on a substrate by means of a first solder having a higher melting point, the first solder can be melted at a lowered temperature without melting a second solder having a lower melting point which solder bonds a second component to the same substrate. After melting the first solder and repairing the first component, the first solder is applied again to a desired position (e.g., footprint) on the substrate, and the first component is soldered again in the evacuated capsule.

An example of this repair will now be described with reference to FIG. 2. It is assumed that the chip component 12 is subjected to repair. In this case, the valve 40 is closed and the valve 36 is opened to operate the vacuum pump 34. As a result, only the capsule 24 is evacuated to thereby lower the melting point of the Pb—Sn solder bonding the chip component 12 down to about 260° C. In this condition, the heat source 18 is operated to heat the ceramic substrate 4 to about 260° C., thereby melting only the Pb—Sn solder bonding the chip component 12. After melting the Pb—Sn solder bonding the chip component 12, the chip component 12 is removed. Then, a Pb—Sn solder is applied again to a footprint on the ceramic substrate 4, and the chip component 12 is mounted on the Pb—Sn solder. The capsule 24 is evacuated again to a desired pressure, and the ceramic substrate 4 is heated again to about 260° C., thus performing resoldering of the chip component 12 without melting the solders bonding the other components 6, 8, 10, 14, and 16.

In general, the melting point of a material rises with an increase in pressure and lowers with a decrease in pressure. The present invention has applied this principle to a reflow soldering apparatus, and the following use patterns are considered.

(1) In the case that two kinds of components A and B to be bonded by two kinds of solders are provided and the melting point of the solder for bonding the component A is higher than that of the solder for bonding the component B, the components A and B can be simultaneously soldered at the same temperature by setting the pressure in a capsule enclosing the component A lower than the pressure surrounding the component B.

(2) In the case that two kinds of components C and D to be bonded by two kinds of solders are provided and the susceptibility to oxidation or the strength of reducing power of the solder for bonding the component C is different from that of the solder for bonding the component D, the components C and D can be soldered under the respective optimum conditions by enclosing the components C and D in individual capsules and producing atmospheres (e.g., oxygen or hydrogen atmosphere) suitable for the different solders in the respective capsules.

(3) In the case that two kinds of components E and F previously bonded to a common substrate by two kinds of solders and the melting point of the solder bonding the component E is higher than or equal to that of the solder bonding the component F, only the solder bonding the component E can be melted by evacuating a capsule enclosing the solder bonding the component E. Alternatively, only the solder bonding the component E can be melted by increasing the pressure in another capsule enclosing the solder bonding the component F.

(4) In the case that the solder in the capsule is desired to be rapidly melted or solidified, the pressure in the capsule can be rapidly changed by making communication of the capsule with the pressure regulating chamber whose inside pressure is preliminarily adjusted to an arbitrary value. Accordingly, the solder in the capsule can be rapidly melted or solidified.

According to the present invention, in the case of soldering a plurality of components on a substrate by using solders having different melting points, the plural components can be simultaneously soldered at the same temperature by enclosing a soldering position of the solder having a higher melting point in a capsule and evacuating the capsule to a given pressure. By performing the soldering under the conditions (e.g., melting point and soldering atmosphere) suitable for the solders for bonding different kinds of components, solder leaching at a soldering position on the substrate can be prevented.

It is possible to realize rapid solder melting or solidification which cannot be conventionally realized because of a problem in heat capacity of a component to be soldered. Accordingly, the grain boundaries of the solder can be made close to thereby improve the fatigue life of the component. A higher-melting point solder bonding a first component mounted on a substrate can be melted at a lowered temperature without melting a lower-melting point solder bonding a second component on the same substrate. Thereafter, the first component can be soldered again.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A reflow soldering apparatus for soldering a first component mounted on a substrate with a first solder having a first melting point and soldering a second component mounted on the substrate with a second solder having a second melting point higher than the first melting point, comprising:

heating means for heating the entire substrate such that the first solder and the second solder on the substrate are melted simultaneously;

a capsule for enclosing only the second component; and evacuating means for decreasing the pressure in the capsule, wherein the first component and the second component are reflow-soldered at substantially the same temperature by operating the evacuating means to decrease the pressure in the capsule by a given amount.

2. A reflow soldering apparatus as defined in claim 1, further comprising:

a pressure sensor for detecting the pressure in the capsule;

a temperature sensor for detecting the temperature in the capsule; and a control unit connected to the heating means, the evacuating means, the pressure sensor, and the temperature sensor.

3. A reflow soldering apparatus as defined in claim 1, further comprising a first valve for selectively making communication and interruption between the capsule and the evacuating means.

4. A reflow soldering apparatus as defined in claim 3, further comprising:

a chamber communicating with the capsule;

second evacuating means for decreasing the pressure in the chamber;

a second valve for selectively making communication and interruption between the capsule and the chamber; and a third valve for selectively making communication and interruption between the chamber and the second evacuating means.

5. A reflow soldering apparatus as defined in claim 4, further comprising:

a second capsule for enclosing the first component; and third evacuating means for decreasing the pressure in the second capsule.

6. A reflow soldering apparatus for selectively melting any one of solders bonding a plurality of components to a substrate each one of said solders having a first melting point, comprising:

heating means for substantially uniformly heating the entire substrate to a temperature below said first melting point;

a capsule for selectively enclosing any one of the components bonded by the solder to be melted; and evacuating means for decreasing, the pressure in the capsule, wherein only the solder bonding the component selectively enclosed in the capsule is melted by operating the evacuating means to decrease the pressure in the capsule by a given amount.

7. A reflow soldering method comprising the steps of:

applying a first solder having a first melting point to a first footprint formed on a substrate;

applying a second d solder having a second melting point higher than the first melting point to a second footprint formed on the substrate;

mounting a first component on the substrate so that a lead of the first component comes into contact with the first solder;

mounting a second component on the substrate so that a lead of the second component comes into contact with the second s older;

enclosing the second component in a capsule;

decreasing the pressure in the capsule; and heating the substrate to a temperature higher than or equal to the first melting point to simultaneously solder the first and second components.

8. A reflow soldering method as defined in claim 7, further comprising the steps of:

detecting the pressure in the capsule;

detecting the temperature in the capsule; and controlling the pressure and the temperature in the capsule.

9. A reflow soldering apparatus for soldering a first component mounted on a substrate with a first solder having a first melting point and soldering a second component mounted on the substrate with a second solder having a second melting point higher than the first melting point, comprising:

heating, means for heating the entire substrate such that the first solder and the second solder are melted simultaneously;

a capsule for enclosing only the first component; and pressurizing means for increasing the pressure in the capsule, wherein the first component and the second component are reflow-soldered at substantially the same temperature by operating the pressurizing means to increase the pressure in the capsule by a given amount.

10. A reflow soldering apparatus as defined in claim 9, further comprising a valve for selectively making communication and interruption between the capsule and the pressurizing means.

11. A reflow soldering method comprising the steps of:

applying a first solder having a first melting point to a first footprint formed on a substrate;

applying a second solder having a second melting point higher than the first melting point to a second footprint formed on the substrate;

mounting a first component on the substrate so that a lead of the first component comes into contact with the first solder;

mounting a second component on the substrate so that a lead of the second component comes into contact with the second solder;

enclosing the first component in a first capsule;

increasing the pressure in the first capsule; and heating the substrate to a temperature higher than or equal to the second melting point to simultaneously solder the first and second components.

12. A reflow soldering method as defined in claim 11, further comprising the steps of:

enclosing the second component in a second capsule; and substituting an inert atmosphere for the atmosphere in at least one of the first capsule and the second capsule.

* * * * *